United States Patent
Huddar et al.

(10) Patent No.: US 10,638,601 B2
(45) Date of Patent: Apr. 28, 2020

(54) APPARATUS COMPRISING CONDUCTIVE TRACES CONFIGURED TO TRANSMIT DIFFERENTIAL SIGNALS IN PRINTED CIRCUIT BOARDS

(71) Applicant: SEAGATE TECHNOLOGY LLC, Cupertino, CA (US)

(72) Inventors: Vinod Arjun Huddar, Karnataka (IN); Abhishek Laguvaram, Telangana (IN)

(73) Assignee: Seagate Technology LLC, Cupertino, CA (US)

( * ) Notice: Subject to any disclaimer, the term of this patent is extended or adjusted under 35 U.S.C. 154(b) by 246 days.

(21) Appl. No.: 15/674,776

(22) Filed: Aug. 11, 2017

(65) Prior Publication Data
US 2019/0050311 A1     Feb. 14, 2019

(51) Int. Cl.
  *H05K 1/02* (2006.01)
  *G06F 17/50* (2006.01)
  *G11C 16/10* (2006.01)
  *G06F 13/40* (2006.01)

(52) U.S. Cl.
  CPC ....... *H05K 1/0245* (2013.01); *G06F 13/4072* (2013.01); *G06F 17/5077* (2013.01); *G06F 17/5081* (2013.01); *G11C 16/10* (2013.01); *H05K 1/024* (2013.01); *H05K 2201/09227* (2013.01); *H05K 2201/10159* (2013.01)

(58) Field of Classification Search
  CPC .............. H05K 1/0245; H05K 1/024; H05K 2201/09227; H05K 2201/10159; G06F 13/4072; G06F 17/5081; G06F 17/5077; G11C 16/10
  See application file for complete search history.

(56) References Cited

U.S. PATENT DOCUMENTS

| | | | | |
|---|---|---|---|---|
| 5,070,474 A | * | 12/1991 | Tuma | G06F 3/0601 703/24 |
| 6,636,922 B1 | * | 10/2003 | Bastiani | G06F 13/4291 709/250 |
| 6,823,502 B2 | * | 11/2004 | Wingren | G06F 17/5045 716/102 |
| 6,843,657 B2 | * | 1/2005 | Driscoll | H05K 7/1454 439/65 |
| 7,001,834 B2 | * | 2/2006 | Devnani | H01L 23/49822 257/E23.062 |

(Continued)

OTHER PUBLICATIONS

Brooks, Douglas, "Signal Integrity Issues and Printed Circuit Board Design," Jul. 4, 2003, pp. 249-268, Prentice Hall.

*Primary Examiner* — Naum Levin
(74) *Attorney, Agent, or Firm* — Kagan Binder, PLLC

(57) ABSTRACT

Systems and methods for routing of conductive traces in a printed circuit board are described. In one embodiment, the method may include routing a first trace in a first layer of a printed circuit board of a solid state drive, routing a second trace in a second layer of the printed circuit board, and routing the first trace and the second trace between a serializer/deserializer (SerDes) of a first controller of the solid state drive and a SerDes of a second controller of the solid state driver. In some cases, the first trace and the second trace may be configured to transmit differential signals to communicate data between the first controller and the second controller. In some embodiments, the second layer may be adjacent to the first layer.

18 Claims, 9 Drawing Sheets

(56) References Cited

U.S. PATENT DOCUMENTS

| | | | | |
|---|---|---|---|---|
| 7,292,452 B2* | 11/2007 | Ng | | H05K 1/0245 |
| | | | | 174/250 |
| 7,388,449 B2* | 6/2008 | Hamada | | H04B 3/30 |
| | | | | 333/12 |
| 7,986,020 B2* | 7/2011 | Kagaya | | H05K 1/0224 |
| | | | | 257/432 |
| 8,027,391 B2* | 9/2011 | Matsubara | | H04L 25/0272 |
| | | | | 326/86 |
| 8,168,891 B1 | 5/2012 | Goergen et al. | | |
| 8,633,399 B2* | 1/2014 | Kagaya | | H01P 1/02 |
| | | | | 174/250 |
| 8,670,243 B2* | 3/2014 | Mitsuhashi | | H05K 1/117 |
| | | | | 361/679.32 |
| 8,847,696 B2* | 9/2014 | Blair | | H01P 3/00 |
| | | | | 333/238 |
| 9,148,313 B2* | 9/2015 | Poulton | | H04L 25/0272 |
| 9,177,609 B2* | 11/2015 | D'Abreu | | G06F 13/1668 |
| 9,241,400 B2* | 1/2016 | Shaw | | H05K 1/0253 |
| 9,310,830 B2* | 4/2016 | Fiedler | | G06F 1/10 |
| 9,419,684 B2* | 8/2016 | Kuroda | | H04B 5/0018 |
| 9,497,860 B2* | 11/2016 | Kim | | H05K 3/403 |
| 9,877,286 B2* | 1/2018 | Kim | | H04W 52/028 |
| 9,979,432 B2* | 5/2018 | Khan | | H04B 1/40 |
| 10,007,632 B2 | 6/2018 | Bailey | | G06F 13/385 |
| 10,152,446 B2* | 12/2018 | Iyer | | G06F 13/4068 |
| 10,231,325 B1* | 3/2019 | Chengson | | H05K 1/116 |
| 10,348,551 B2* | 7/2019 | Sasaki | | H04L 41/06 |
| 2005/0121766 A1* | 6/2005 | Devnani | | H01L 23/49822 |
| | | | | 257/691 |
| 2013/0003480 A1* | 1/2013 | D'Abreu | | G06F 13/1668 |
| | | | | 365/218 |
| 2015/0089164 A1* | 3/2015 | Ware | | G11C 5/02 |
| | | | | 711/149 |
| 2018/0034437 A1* | 2/2018 | Marshall | | H03H 7/427 |

* cited by examiner

| Layers 705 | Thickness 710 | PCB Stack 715 | Type 720 Dk Df | Description 725 |
|---|---|---|---|---|
| | 0.0114/0.0508 | | 3.5 | Soldermask |
| 1 | 0.0452 | | F / S | 18um w/plating |
| | 0.0698 | 1067 | 3.61 0.0149 | fill |
| 2 | 0.0152 | | P | 18um |
| | 0.0635 | 1067 | 3.66 0.0147 | core |
| 3 | 0.0152 | | S | 18um |
| | 0.1499 | 1078*2 | 3.81 0.0139 | fill |
| 4 | 0.0152 | | S | 18um |
| | 0.0635 | 1067 | 3.66 0.0147 | core |
| 5 | 0.0152 | | P | 18um |
| | 0.0660 | 1067 | 3.64 0.0148 | fill |
| 6 | 0.0152 | | P | 18um |
| | 0.0635 | 1067 | 3.66 0.0147 | core |
| 7 | 0.0152 | | S | 18um |
| | 0.1499 | 1078*2 | 3.81 0.0139 | fill |
| 8 | 0.0152 | | S | 18um |
| | 0.0635 | 1067 | 3.66 0.0147 | core |
| 9 | 0.0152 | | P | 18um |
| | 0.0698 | 1067 | 3.61 0.0149 | fill |
| 10 | 0.0452 | | F / S | 18um w/plating |
| | 0.0114/0.0508 | | 3.5 | Soldermask |

700

*FIG. 7*

APPARATUS COMPRISING CONDUCTIVE TRACES CONFIGURED TO TRANSMIT DIFFERENTIAL SIGNALS IN PRINTED CIRCUIT BOARDS

SUMMARY

The present disclosure is directed to methods and systems for routing of conductive traces in a printed circuit board. In some embodiments, the present systems and methods may include routing conductive traces in a broadside coupling fashion in a printed circuit board of a storage drive.

A storage system for routing of conductive traces in a printed circuit board is described. In one embodiment, the storage system device may include a storage drive, a printed circuit board of the storage drive, a first trace routed in a first layer of the printed circuit board of the storage drive, and a second trace routed in a second layer of the printed circuit board. In some cases, the first trace and the second trace may be routed between a serializer/deserializer (SerDes) of a first controller of the storage drive and a SerDes of a second controller of the storage drive. In some cases, the first trace and other traces of the printed circuit board may electrically connect components of the printed circuit board, components of the storage drive, or both. In some cases, the second layer may be adjacent to the first layer.

In some embodiments, a third trace and a fourth trace routed between a SerDes of a connector of the storage drive and the SerDes of the first controller, wherein the third trace is in the first layer and the fourth trace is in the second layer, or the third trace is in a third layer and the fourth trace is in a fourth layer adjacent to the third layer.

In some embodiments, the storage drive connector is configured to receive data from a host of the storage drive and provide the data to the SerDes of the storage drive connector, wherein the SerDes of the storage drive connector provides the data to the SerDes of the first controller over the third trace and the fourth trace. In some embodiments, the first controller may be configured to transmit at least a portion of the data to the second controller over the first trace and the second trace. In some cases, the second controller may be configured to write the at least portion of the data to one or more NAND dies of the storage drive controlled by the second controller.

In some cases, the storage drive connector may include at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, or any combination thereof. In some cases, the first controller may drive the first trace and the second trace with a differential signal to communicate data between the first controller and the second controller.

In some cases, the differential impedance between the first trace and the second trace may be between 50 and 100 Ohms when the first trace and the second trace are driven by the differential signal. In some embodiments, the differential signal may include the first trace being driven by a first signal and the second trace simultaneously being driven by a second signal that is equal in magnitude, opposite in polarity, and symmetrical to the first signal. In some cases, the differential impedance between the first trace and the second trace may depend on at least one or more physical aspects of the first trace and the second trace.

In some cases, the one or more physical aspects of the first trace and the second trace may include at least one of a distance between the first trace and the second trace, a width of the first trace, a width of the second trace, a thickness of the first trace, a thickness of the second trace, a height of a substrate in which the traces are embedded, a dimension of a first reference plane, a dimension of a second reference plane, a distance between the first trace and a first reference plane, a distance between the second trace and a second reference plane, a relative permittivity of the substrate, or any combination thereof.

In some cases, the storage drive includes a solid state drive. In some embodiments, one or more dielectrics or dielectric materials may be placed between the first reference plane and the second reference plane. In some cases, the first trace and the second trace may be embedded in one or more dielectrics. In some embodiments, a first dielectric or dielectric material may be placed between the first trace and the second trace, a second dielectric may be placed above the first trace, a third dielectric may be placed below the second trace. In some cases, a first reference plane may be placed above the first dielectric, and a second reference plane may be placed above the third dielectric.

An apparatus for routing of conductive traces in a printed circuit board is also described. In one embodiment, the apparatus may include a first trace routed in a first layer of a printed circuit board of the apparatus and a second trace routed in a second layer of the printed circuit board, the second layer being adjacent to the first layer. In some cases, the first trace and the second trace routed between a serializer/deserializer (SerDes) of a first controller of the apparatus and a SerDes of a second controller of the apparatus. In some cases, the first trace and other traces of the printed circuit board may electrically connect components of the printed circuit board, components of the apparatus, or both. In some cases, the second layer may be adjacent to the first layer.

A method for routing of conductive traces in a printed circuit board is also described. In one embodiment, the method may include routing a first trace in a first layer of a printed circuit board of a solid state drive, routing a second trace in a second layer of the printed circuit board, and routing the first trace and the second trace between a serializer/deserializer (SerDes) of a first controller of the solid state drive and a SerDes of a second controller of the solid state driver. In some cases, the first trace and the second trace may be configured to transmit differential signals to communicate data between the first controller and the second controller. In some embodiments, the first trace and other traces of the printed circuit board may electrically connect components of the printed circuit board, components of the solid state drive, or both. In some embodiments, the second layer may be adjacent to the first layer.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

FIG. 7 shows another embodiment of an environment in accordance with various aspects of this disclosure;

DETAILED DESCRIPTION

Figure 1:
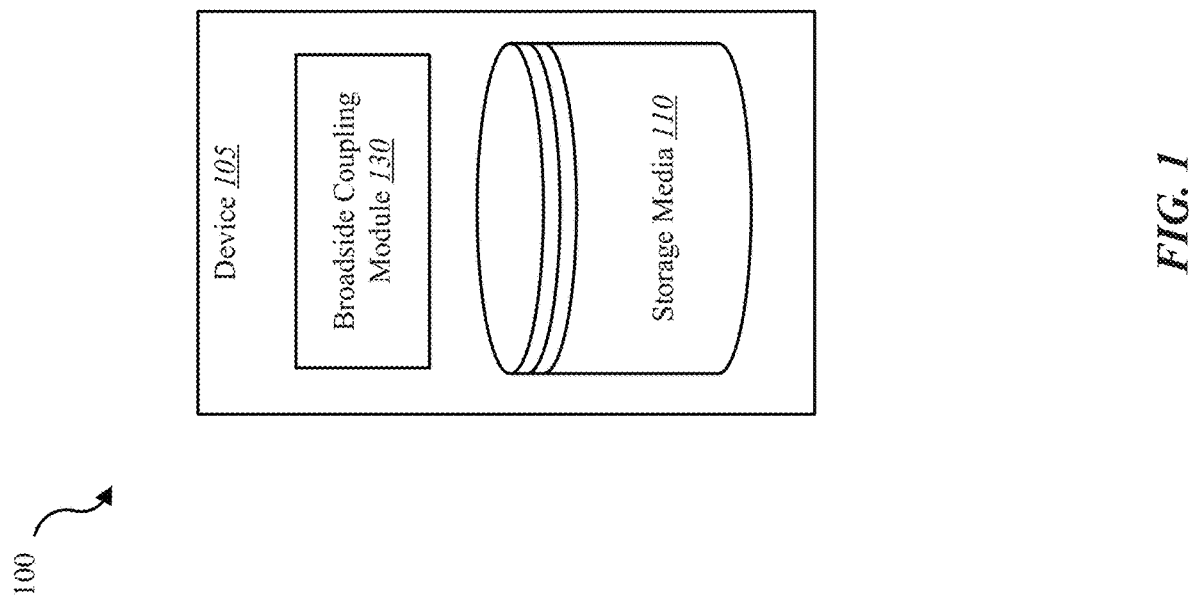
FIG. 1 is a block diagram of an example of a system in accordance with various embodiments.

The following relates generally to routing of conductive traces in a printed circuit board. In some embodiments, a storage drive may include a high density printed circuit board (PCB). In some cases, the PCB may include several layers with components of the PCB routed on and/or between the layers. In some embodiments, a trace may include a thin strip of conductive material such as copper that electrically connects various connectors, components, and/or chips on the PCB to each other. In a multilayer PCB, a trace may be routed in any of the layers, and vias may be used to connect a trace between two or more layers.

In some embodiments, a multilayer PCB of the present systems and methods may have 10 or more layers and a thickness of 30 mils or less. As one example, a PCB with a thickness of 30 mils or less and 12 layers may have a spacing of 2.5 mils between any two layers of the multilayer PCB. As the spacing between layers drops to 3 mils or less, the odds of encountering broadside crosstalk when two signals are routed parallel in adjacent layers increases.

The present systems and methods reduce the odds of encountering broadside crosstalk between traces of two adjacent layers by configuring the PCB with broadside coupling of differential pairs or broadside coupling striplines, thus improving the design of high density PCBs. In one embodiment, the broadside coupling would be applied to a differential signal line of a serializer/deserializer (SerDes). In one embodiment, the present systems and methods may be configured with a spacing between layers of 3 mils or less. By implementing broadside coupled traces with the spacing between layers being 3 mils or less, the present systems and methods free up route space in each of the PCB layers horizontally, and thus enabling a higher route density for the PCB.

A SerDes is a pair of functional blocks commonly used in high speed communications to compensate for limited input/output. These blocks may be configured to convert data between serial data and parallel interfaces in each direction. The term "SerDes" may generically refer to interfaces used in various technologies and applications. One use of a SerDes is to provide data transmission over a single/differential line in order to minimize the number of I/O pins and interconnects.

Differential signaling is a method for electrically transmitting information using two complementary signals. The technique sends the same electrical signal as a differential pair of signals, each in its own conductor. The pair of conductors can be wires twisted together or traces on a PCB. The receiving circuit responds to the electrical difference between the two signals, rather than the difference between a single wire and ground. Thus, a differential signal may include a first signal driven on a first trace and a second signal driven on a second trace, where the second signal is equal in magnitude, opposite in polarity, and symmetrical to the first signal. In some cases, the first signal may be referred to as the positive signal (P signal) and the second signal may be referred to as the negative signal (N signal).

A conventional system avoids using broadside coupling because in the conventional system, broadside coupling may cause greater amounts of crosstalk than those routed using edge coupling or side-by-side. A conventional PCB routes SerDes differential pairs in the same layer of the PCB using edgewise coupling between the traces that carry the differential signals, which may be done to avoid delays, ease of computing the differential impedance, and ease of routing. However, the conventional approach fails to consider the effects routing density has on differential signals especially when there are a relatively high number of SerDes lines to be routed in the PCB.

In one embodiment, the present systems and methods may route traces for differential signals in adjacent layers of a multilayer PCB. In some cases, the present systems and methods may use a spacing of 3 mils or less between any two layers of the multilayer PCB. For example, the spacing between layers of the present systems and methods may have a spacing of 3 mils, 2.5 mils, 2 mils, or 1.5 mils, etc.

In the present systems and methods, a storage drive may include two or more controller chips with one or more SerDes lines running between the two or more controllers. For example, traces for 8, 16, 32, 64, or 128 lanes of differential pair of traces may be routed between a first controller and a second controller (e.g., 32 differential SerDes lanes, etc.). In one example, each differential pair of traces may transmit data over 8 Gbps links between the controllers. In some cases, each of the multiple lanes of differential pair of traces may be matched-length between the controllers. In one embodiment, the multiple lanes of differential pair of traces may be routed on one or more pairs of adjacent layers. For example, 8 differential pairs of traces or 8 SerDes differential lanes may all be routed on a single pair of layers, where each of the 8 P signal lines is routed on a first layer and each of the 8 N signal lines is routed on a second layer adjacent to the first layer. In some embodiments, the multiple lanes of differential pair of traces may be routed on two or more pairs of adjacent layers. For example, 32 differential pairs of traces may be routed on four pairs of adjacent layers with 8 differential pairs of traces per layer. For instance, 8 P signal lines may be routed on a first layer and 8 N signal lines may be routed on a second layer adjacent to the first layer, 8 P signal lines may be routed on a third layer and 8 N signal lines may be routed on a fourth layer adjacent to the third layer, 8 P signal lines may be routed on a fifth layer and 8 N signal lines may be routed on a sixth layer adjacent to the fifth layer, 8 P signal lines may be routed on a seventh layer and 8 N signal lines may be routed on an eighth layer adjacent to the seventh layer, for a total of 32 P signal lines and 32 N signal lines routed on four pairs of adjacent layers.

In one embodiment, the present systems and methods may route SerDes differential pairs between a connector of a storage device and one or more controllers of the same storage device. Additionally or alternatively, the present systems and methods may route SerDes differential pairs between two or more controllers of the storage device. For example, the present systems and methods may route one or more SerDes differential pairs between a first controller and a second controller and route one or more SerDes differential pairs between the second controller and a third controller. In the same example, the present systems and methods may route one or more SerDes differential pairs between the first controller and the third controller. Examples of the connector of the storage device may include at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, or any combination thereof. In one embodiment, the storage device may be implemented in one or more form factors. Examples of form factors include 3.5-inch enclosure with SATA or SAS connector, 2.5-inch enclosure with SATA or SAS connector, mSATA socket, PCIe expansion card, M.2 expansion card, U.2 expansion card, or any combination thereof.

In one embodiment, the differential impedance of a given pair of traces used for differential pair signaling may be based at least in part on one or more physical aspects of the traces. Examples of the one or more physical aspects include the spacing between the traces, the width of each trace, the thickness of each trace, a height of a substrate in which the traces are embedded, a value of the substrate dielectric, etc.

In some cases, the present systems and methods may generate a 3D simulation of the traces in the adjacent layers. In some cases, the present systems and methods may calculate differential impedance for the traces in adjacent layers based at least in part on the 3D simulation. In one embodiment, the present systems and methods may compute differential impedance and spacing between layers of the PCB based at least in part on simulated physical aspects of the traces. As one example, the present systems and methods may analyze a 3D simulation of the physical aspects of the traces to produce a particular differential impedance between the traces in adjacent layers. For example, the present systems and methods may analyze a 3D simulation of the physical aspects of the traces to produce a differential impedance somewhere at or between the range of 50 Ohms and 100 Ohms.

FIG. 1 is a block diagram illustrating one embodiment of an environment 100 in which the present systems and methods may be implemented. The environment may include device 105 and storage media 110. The storage media 110 may include any combination of hard disk drives, solid state drives, and hybrid drives that include both hard disk and solid state drives. In some embodiments, the storage media 110 may include shingled magnetic recording (SMR) storage drives. In some embodiments, the systems and methods described herein may be performed on a single device such as device 105. In some cases, the methods described herein may be performed on multiple storage devices or a network of storage devices such as a cloud storage system and/or a distributed storage system. Examples of device 105 include a storage server, a storage enclosure, a storage controller, storage drives in a distributed storage system, storage drives on a cloud storage system, storage devices on personal computing devices, storage devices on a server, or any combination thereof. In some configurations, device 105 may include broadside coupling module 130. In one example, the device 105 may be coupled to storage media 110. In some embodiments, device 105 and storage media 110 may be components of flash memory or a solid state drive and/or another type of storage drive. Alternatively, device 105 may be a component of a host of the storage media 110 such as an operating system, host hardware system, or any combination thereof.

In one embodiment, device 105 may be a computing device with one or more processors, memory, and/or one or more storage devices. In some cases, device 105 may include a wireless storage device. In some embodiments, device 105 may include a cloud drive for a home or office setting. In one embodiment, device 105 may include a network device such as a switch, router, access point, or any combination thereof. In one example, device 105 may be operable to receive data streams, store and/or process data, and/or transmit data from, to, or in conjunction with one or more local and/or remote computing devices.

The device 105 may include a database. In some cases, the database may be internal to device 105. In some embodiments, storage media 110 may include a database. Additionally, or alternatively, the database may include a connection to a wired and/or a wireless database. Additionally, as described in further detail herein, software and/or firmware (for example, stored in memory) may be executed on a processor of device 105. Such software and/or firmware executed on the processor may be operable to cause the device 105 to monitor, process, summarize, present, and/or send a signal associated with the operations described herein.

In some embodiments, storage media 110 may connect to device 105 via one or more networks. Examples of networks include cloud networks, local area networks (LAN), wide area networks (WAN), virtual private networks (VPN), a personal area network, near-field communication (NFC), a telecommunications network, wireless networks (using 802.11, for example), and cellular networks (using 3G and/or LTE, for example), or any combination thereof. In some configurations, the network may include the Internet and/or an intranet. The device 105 may receive and/or send signals over a network via a wireless communication link. In some embodiments, a user may access the functions of device 105 via a local computing device, remote computing device, and/or network device. For example, in some embodiments, device 105 may include an application that interfaces with a user. In some cases, device 105 may include an application that interfaces with one or more functions of a network device, remote computing device, and/or local computing device.

In one embodiment, the storage media 110 may be internal to device 105. As one example, device 105 may include a storage controller that interfaces with storage media of storage media 110. In some cases, broadside coupling module 130 may perform one or more actions in conjunction with storage media 110. In one example, broadside coupling module 130 may generate a three-dimensional (3D) model of one or more differential pair of conductors or differential pair of traces in a printed circuit board (PCB). In some cases, broadside coupling module 130 may simulate one or more physical aspects of the one or more differential pair of conductors. In some cases, broadside coupling module 130 may calculate a differential impedance for each of the one or more differential pair of conductors based on the particular physical aspects for each differential pair of conductors. In one embodiment, broadside coupling module 130 may compute differential impedance and spacing between layers of the PCB based at least in part on simulated physical aspects of the differential pair of conductors. As one example, the present systems and methods may analyze the 3D simulation to produce a particular differential impedance between the differential pair of conductors in adjacent layers of the PCB.

Figure 2:
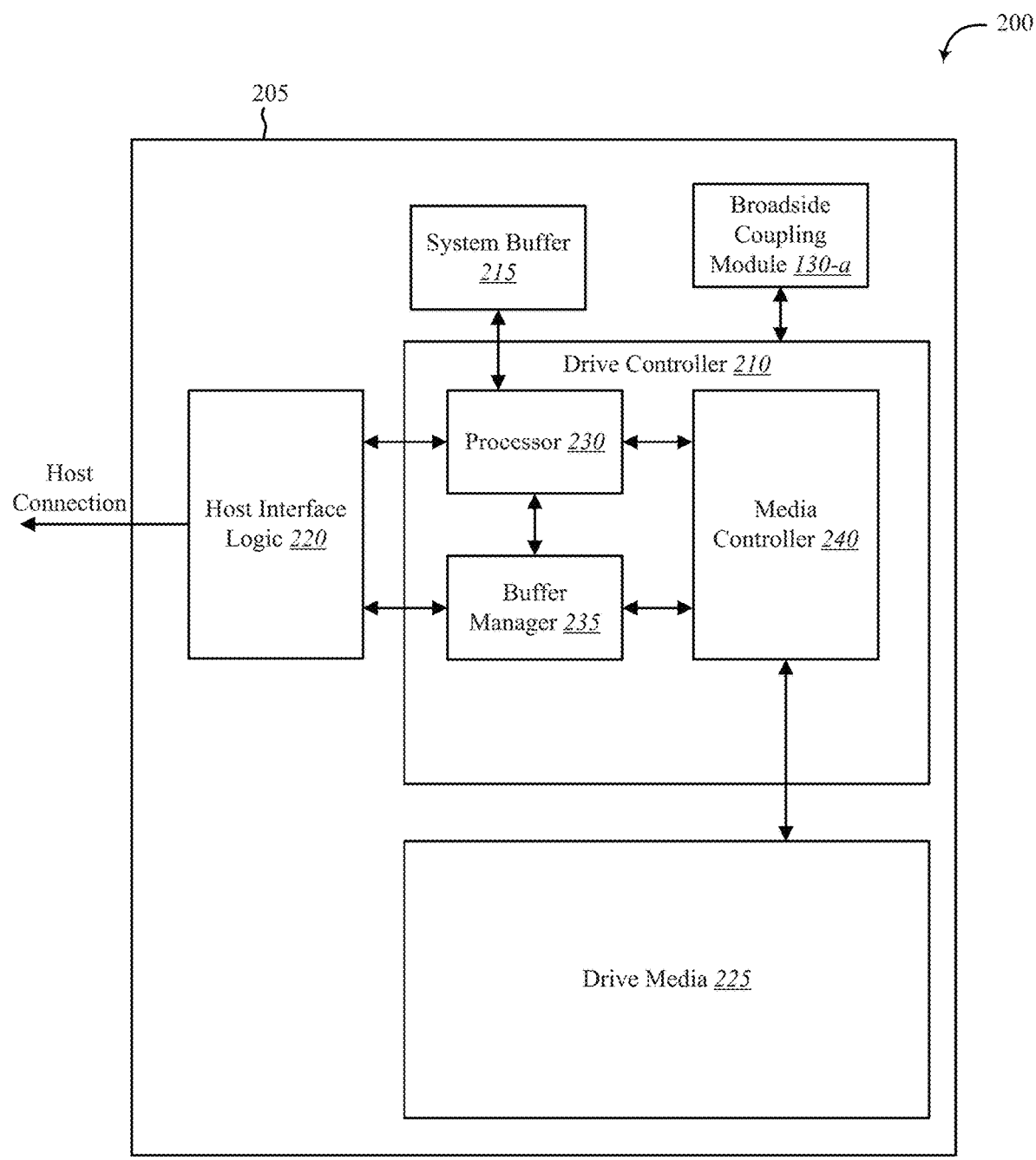
FIG. 2 shows a block diagram of a device in accordance with various aspects of this disclosure.

FIG. 2 shows a block diagram 200 of an apparatus 205 for use in electronic communication, in accordance with various aspects of this disclosure. The apparatus 205 may be an example of one or more aspects of device 105 described with reference to FIG. 1. The apparatus 205 may include a drive controller 210, system buffer 215, host interface logic 220, drive media 225, and broadside coupling module 130-a. Each of these components may be in communication with each other and/or other components directly and/or indirectly.

One or more of the components of the apparatus 205, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used such as Structured/Platform ASICs, Field Programmable Gate Arrays (FPGAs), and other Semi-Custom ICs, which may be programmed in any manner known in the art. The functions of each module may also be implemented, in whole or in part, with instructions embodied in memory formatted to be executed by one or more general and/or application-specific processors.

In one embodiment, the drive controller 210 may include a processor 230, a buffer manager 235, and a media controller 240. The drive controller 210 may process, via processor 230, read and write requests in conjunction with the host interface logic 220, the interface between the apparatus 205 and the host of apparatus 205. The system buffer 215 may hold data temporarily for internal operations of apparatus 205. For example, a host may send data to apparatus 205 with a request to store the data on the drive media 225. Drive media 225 may include one or more disk platters, flash memory, any other form of non-volatile memory, or any combination thereof. The driver controller 210 may process the request and store the received data in the drive media 225. In some cases, a portion of data stored in the drive media 225 may be copied to the system buffer 215 and the processor 230 may process or modify this copy of data and/or perform an operation in relation to this copy of data held temporarily in the system buffer 215.

In some embodiments, broadside coupling module 130-a may include at least one of one or more processors, one or more memory devices, one or more storage devices, instructions executable by one or more processors stored in one or more memory devices and/or storage devices, or any combination thereof. Although depicted outside of drive controller 210, in some embodiments, broadside coupling module 130-a may include software, firmware, and/or hardware located within drive controller 210 and/or operated in conjunction with drive controller 210. For example, broadside coupling module 130-a may include at least a portion of processor 230, buffer manager 235, and/or media controller 240. In one example, broadside coupling module 130-a may include one or more instructions executed by processor 230, buffer manager 235, and/or media controller 240.

Figure 3:
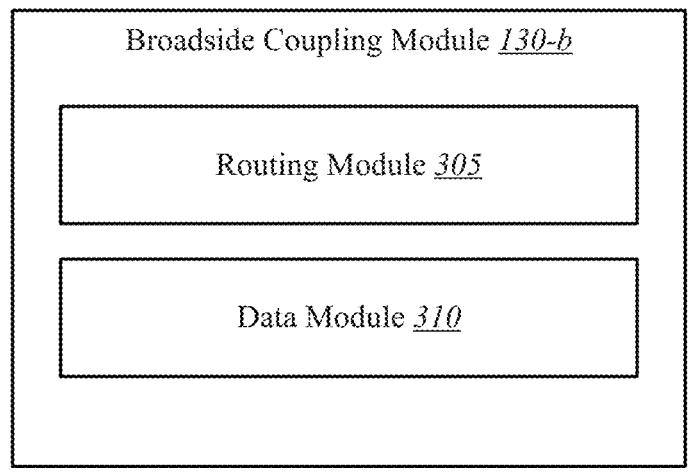
FIG. 3 shows a block diagram of one or more modules in accordance with various aspects of this disclosure.

FIG. 3 shows a block diagram of broadside coupling module 130-b. The broadside coupling module 130-b may include one or more processors, memory, and/or one or more storage devices. The broadside coupling module 130-b may include routing module 305 and data module 310. The broadside coupling module 130-b may be one example of broadside coupling module 130 of FIGS. 1 and/or 2. Each of these components may be in communication with each other.

In one embodiment, routing module 305 may be configured to route a first trace in a first layer of a printed circuit board (PCB). In one example, the PCB may be implemented in a storage drive. Thus, in one embodiment, the first trace and other traces of the PCB may electrically connect various connectors and/or components on the PCB of a storage drive. Additionally or alternatively, the first trace and other traces of the PCB may electrically connect various connectors and/or components of the storage drive in which the PCB is placed. In some embodiments, the storage drive includes a solid state drive.

In some embodiments, routing module 305 may be configured to route a second trace in a second layer of the printed circuit board. In some cases, the second layer may be adjacent to the first layer. Although reference is made herein to a first layer adjacent to a second layer, it is understood that the first layer and the second layer may be any two adjacent layers in a multilayer PCB. For example, in a 10 layer PCB, the first layer may refer to layer 7 and the second layer may refer to layer 8. Alternatively, the first layer may refer to layer 7 and the second layer may refer to layer 6, etc. Similarly, any reference to a third layer adjacent to a fourth layer, or any other adjacent layers, may refer to any two adjacent layers in a multilayer PCB.

In some embodiments, a differential impedance between the first trace and the second trace may be set to a value between 50 and 100 Ohms while the first trace and the second trace are driven by a differential signal. In some cases, the differential signal may include the first trace being driven by a first signal and the second trace simultaneously being driven by a second signal that is equal in magnitude, opposite in polarity, and symmetrical to the first signal. In some embodiments, the differential impedance between the first trace and the second trace is based at least in part on at least one or more physical aspects of the first trace and the second trace. In some cases, the one or more physical aspects of the first trace and the second trace includes at least one of a distance between the first trace and the second trace, a width of the first trace, a width of the second trace, a thickness of the first trace, a thickness of the second trace, a height of a substrate in which the traces are embedded, a dimension of a first reference plane, a dimension of a second reference plane, a distance between the first trace and a first reference plane, a distance between the second trace and a second reference plane, a relative permittivity of the substrate, or any combination thereof.

In some embodiments, a first dielectric is placed between the first trace and the second trace, a second dielectric is placed above the first trace, a third dielectric is placed below the second trace, a first reference plane is placed above the first dielectric, and a second reference plane is placed above the third dielectric. In some embodiments, the differential impedance between the first trace and the second trace is based at least in part on at least one or more physical aspects associated with the first dielectric, the second dielectric, the third dielectric, the first reference plane, or the second reference plane, or any combination thereof.

In some embodiments, the first and second traces may be broadside coupled to one another. In one embodiment, the data module 310 may drive a pair of differential signals down the first and second traces. In one embodiment, the first and second traces may be referred to as a differential pair of traces, a differential pair of conductors, or a differential pair. In some embodiments, routing module 305 may be configured to route at least one differential pair of traces between a serializer/deserializer (SerDes) of a first controller of a storage drive and a SerDes of a second controller of the storage drive. In some embodiments, the first controller may drive the first trace and the second trace with a differential signal to transmit data to the second controller. Similarly, the second controller may drive another pair of traces with a differential signal to transmit data to the first controller.

As one example, routing module 305 may route at least one differential pair of traces between a serializer of the first controller and a deserializer of the second controller, and route at least one differential pair of traces between a serializer of the second controller and a deserializer of the first controller. When routing module 305 routes two or more differential pairs of traces between the SerDes of the first controller and the SerDes of the second controller, the routing module 305 may route each of the two or more differential pairs in the same two adjacent layers. For example, routing module 305 may route a P signal line of a first differential pair of traces in a first layer and an N signal line of the first differential pair of traces in a second layer adjacent to the first layer, and may route a P signal line of a second differential pair of traces in the first layer and an N signal line of the second differential pair of traces in the second layer. Additionally or alternatively, routing module 305 may route one or more differential pairs in two different pairs of adjacent layers. For example, routing module 305 may route a P signal line of a first differential pair of traces in a first layer and an N signal line of the first differential pair of traces in a second layer adjacent to the first layer, and may route a P signal line of a second differential pair of traces in a third layer and an N signal line of the second differential pair of traces in a fourth layer adjacent to the third layer.

In some embodiments, routing module 305 may be configured to route at least one differential pair of traces between a SerDes of a connector of a storage drive and a SerDes of at least one controller of the storage drive. For example, routing module 305 may route at least one differential pair of traces between a serializer of a connector of a storage drive and a deserializer of a hardware controller of the storage drive, and route at least one differential pair of traces between a serializer of the hardware controller and a deserializer of the connector. In some cases, routing module 305 may route a first differential pair of traces between a SerDes of a connector of a storage drive and a SerDes of a first controller of the storage drive, and may route a second differential pair of traces between the SerDes of the connector and a SerDes of a second controller of the storage drive.

In some embodiments, routing module 305 may route a P signal line of a differential pair of traces from a SerDes of a connector of a storage drive, through a first layer of a PCB of the storage drive, to a SerDes of a controller of the storage drive, and may route an N signal line of the differential pair of traces from the SerDes of the connector, through a second layer of a PCB adjacent to the first layer, to the SerDes of the controller of the storage drive.

In some embodiments, data module 310 may be configured to receive data from a host of a storage drive and provide the data to a SerDes of a connector of the storage drive. In some cases, the SerDes of the storage drive connector provides the data to the SerDes of the first connector by driving differential signals over a differential pair of traces (e.g., driving a P signal over the P signal line of the differential pair of traces in the first layer and driving an N signal over the N signal line of the differential pair of traces in the second layer).

In some embodiments, data module 310 may be configured to transmit at least a portion of the data to the second controller over the first trace and the second trace, wherein the second controller is configured to write the at least a portion of data to one or more NAND dies of the storage drive controlled by the second controller.

In some embodiments, a connector of a storage drive described herein may include at least one of a serial advanced technology attachment (SATA) connector, mini SATA (mSATA) connector, SATA Express connector, small computer system interface (SCSI) connector, serially attached SCSI (SAS) connector, peripheral component interconnect express (PCIe) connector, M.2 connector, U.2 connector, non-volatile memory express (NVMe) connector, or any combination thereof.

Figure 4:
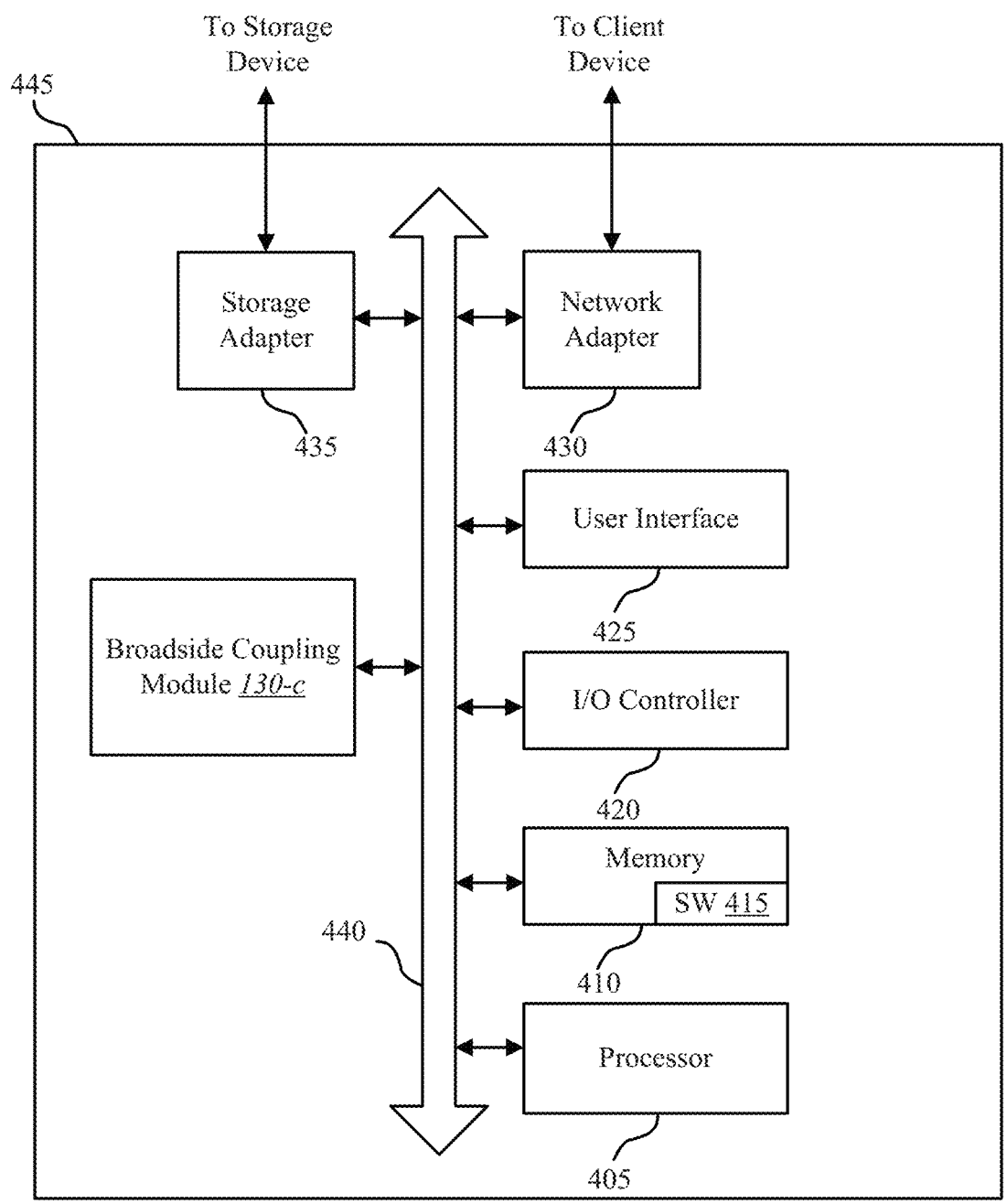
FIG. 4 shows a diagram of a system in accordance with various aspects of this disclosure.

FIG. 4 shows a system 400 for routing of conductive traces in a printed circuit board, in accordance with various examples. System 400 may include an apparatus 445, which may be an example of any one of device 105 of FIG. 1 and/or device 205 of FIG. 2.

Apparatus 445 may include components for bi-directional voice and data communications including components for transmitting communications and components for receiving communications. For example, apparatus 445 may communicate bi-directionally with one or more storage devices and/or client systems. This bi-directional communication may be direct (apparatus 445 communicating directly with a storage system, for example) and/or indirect (apparatus 445 communicating indirectly with a client device through a server, for example).

Apparatus 445 may also include a processor module 405, and memory 410 (including software/firmware code (SW) 415), an input/output controller module 420, a user interface module 425, a network adapter 430, and a storage adapter 435. The software/firmware code 415 may be one example of a software application executing on apparatus 445. The network adapter 430 may communicate bi-directionally, via one or more wired links and/or wireless links, with one or more networks and/or client devices. In some embodiments, network adapter 430 may provide a direct connection to a client device via a direct network link to the Internet via a POP (point of presence). In some embodiments, network adapter 430 of apparatus 445 may provide a connection using wireless techniques, including digital cellular telephone connection, Cellular Digital Packet Data (CDPD) connection, digital satellite data connection, and/or another connection. The apparatus 445 may include broadside coupling module 130-c, which may perform the functions described above for the broadside coupling module 130 of FIGS. 1, 2, and/or 3.

The signals associated with system 400 may include wireless communication signals such as radio frequency, electromagnetics, local area network (LAN), wide area network (WAN), virtual private network (VPN), wireless network (using 802.11, for example), cellular network (using 3G and/or LTE, for example), and/or other signals. The network adapter 430 may enable one or more of WWAN (GSM, CDMA, and WCDMA), WLAN (including BLUETOOTH® and Wi-Fi), WMAN (WiMAX) for mobile communications, antennas for Wireless Personal Area Network (WPAN) applications (including RFID and UWB), or any combination thereof.

One or more buses 440 may allow data communication between one or more elements of apparatus 445 such as processor module 405, memory 410, I/O controller module 420, user interface module 425, network adapter 430, and storage adapter 435, or any combination thereof.

The memory 410 may include random access memory (RAM), read only memory (ROM), flash memory, and/or other types. The memory 410 may store computer-readable, computer-executable software/firmware code 415 including instructions that, when executed, cause the processor module 405 to perform various functions described in this disclosure. Alternatively, the software/firmware code 415 may not be directly executable by the processor module 405 but may cause a computer (when compiled and executed, for example) to perform functions described herein. Alternatively, the computer-readable, computer-executable software/firmware code 415 may not be directly executable by the processor module 405, but may be configured to cause a computer, when compiled and executed, to perform functions described herein. The processor module 405 may include an intelligent hardware device, for example, a central processing unit (CPU), a microcontroller, an application-specific integrated circuit (ASIC), field programmable gate array (FPGA), or any combination thereof.

In some embodiments, the memory 410 may contain, among other things, the Basic Input-Output system (BIOS) which may control basic hardware and/or software operation such as the interaction with peripheral components or devices. For example, at least a portion of the broadside coupling module 130-c to implement the present systems and methods may be stored within the system memory 410. Applications resident with system 400 are generally stored on and accessed via a non-transitory computer readable medium, such as a hard disk drive or other storage medium. Additionally, applications can be in the form of electronic signals modulated in accordance with the application and data communication technology when accessed via a network interface such as network adapter 430.

Many other devices and/or subsystems may be connected to and/or included as one or more elements of system 400 (for example, a personal computing device, mobile computing device, smart phone, server, internet-connected device, cell radio module, or any combination thereof). In some embodiments, all of the elements shown in FIG. 4 need not be present to practice the present systems and methods. The devices and subsystems can be interconnected in different ways from that shown in FIG. 4. In some embodiments, an aspect of some operation of a system, such as that shown in FIG. 4, may be readily known in the art and are not discussed in detail in this application. Code to implement the present disclosure can be stored in a non-transitory computer-readable medium such as one or more of system memory 410 or other memory. The operating system provided on I/O controller module 420 may be a mobile device operation system, a desktop/laptop operating system, or another known operating system.

The I/O controller module 420 may operate in conjunction with network adapter 430 and/or storage adapter 435. The network adapter 430 may enable apparatus 445 with the ability to communicate with client devices such as device 105 of FIG. 1, and/or other devices over a communication network. Network adapter 430 may provide wired and/or wireless network connections. In some cases, network adapter 430 may include an Ethernet adapter or Fibre Channel adapter. Storage adapter 435 may enable apparatus 445 to access one or more data storage devices such as storage device 110. The one or more data storage devices may include two or more data tiers each. The storage adapter 445 may include one or more of an Ethernet adapter, a Fibre Channel adapter, Fibre Channel Protocol (FCP) adapter, a SCSI adapter, and iSCSI protocol adapter.

Figure 5:
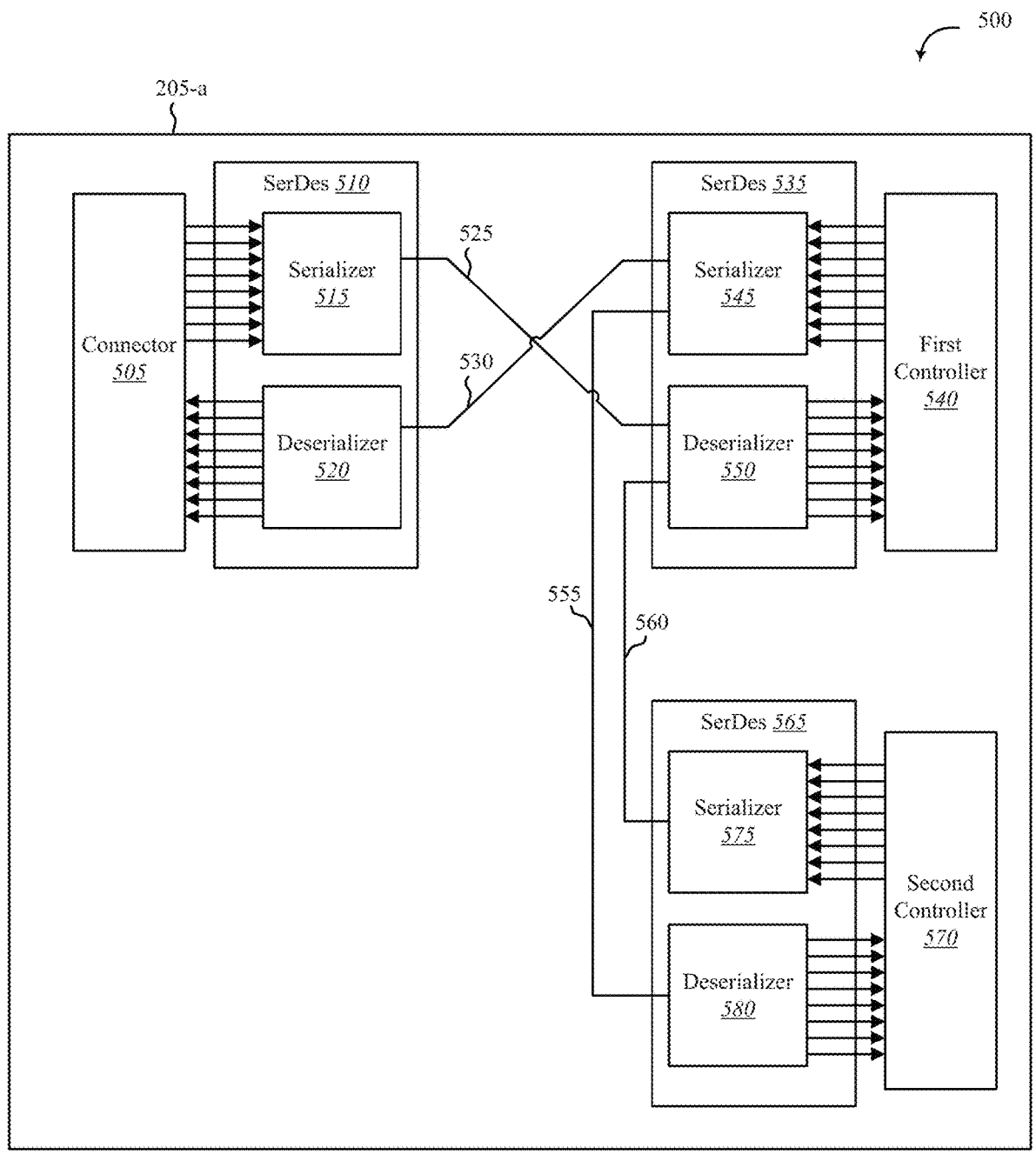
FIG. 5 shows one embodiment of an environment in accordance with various aspects of this disclosure.

FIG. 5 shows an environment 500 for routing of conductive traces in a printed circuit board, in accordance with various examples. At least one aspect of environment 500 may be implemented in conjunction with device 105 of FIG. 1, apparatus 205 of FIG. 2, and/or broadside coupling module 130 depicted in FIGS. 1, 2, 3, and/or 4.

As depicted, environment 500 may include apparatus 205-a. Apparatus 205-a may be one example of at least a portion of apparatus 205 of FIG. 2. As shown, apparatus 205-a may include connector 505, SerDes 510, differential pair of traces 525, differential pair of traces 530, SerDes 535, first controller 540, differential pair of traces 555, differential pair of traces 560, SerDes 565, and second controller 570. In one embodiment, connector 505 may connect to SerDes 510. SerDes 510 may include serializer 515 and deserializer 520. In some cases, differential pair of traces 525, 530, 555, and/or 560 may be routed on a printed circuit board (PCB) of apparatus 205-a. In one embodiment, first controller 540 and/or second controller 570 may be examples of driver controller 210 of FIG. 2. Although FIG. 5 depicts SerDes 510 of connector 505 connecting to SerDes 535 of first controller 540, SerDes 510 of connector 505 may additionally or alternatively connect directly to SerDes 565 of second controller 570.

In one embodiment, serializer 515 may serialize data incoming from connector 505 and send the serialized data to deserializer 550 over differential pair of traces 525. Deserializer 550 may then de-serialize the data and provide the de-serialized data to first controller 540. In one embodiment, first controller 540 may then store the provided data to a storage medium of 205-a (e.g., drive media 225). In some embodiments, first controller 540 may send the provided data to serializer 545, which may serialize the data and send the serialized data to deserializer 580 over differential pair of traces 555. Deserializer 580 may then may de-serialize the data and provide the de-serialized data to second controller 570. In some cases, second controller 570 may then store the provided data to a storage medium of 205-a. In some embodiments, SerDes 535 may receive the serialized data from serializer 515 and transmit the received data to deserializer 580 without providing the data to first controller 540.

In some cases, at least one of the differential pair of traces 525, 530, 555, and 560 may include broadside coupled traces in a PCB of apparatus 205-a. In one example, at least one of the differential pair of traces 525, 530, 555, and 560 may include a first trace in a first layer of a PCB and include a second trace in a second layer of the PCB. In some cases, the second layer may be adjacent to the first layer, such as above the first layer or below the first layer.

In one embodiment, at least one of the differential pairs of traces 525, 530, 555, and 560 may represent one or more differential pairs of traces. For example, differential pair of traces 525, 530, 555, and/or 560 may represent 2, 4, 8, 16, or 32 differential pairs of traces. In one example, differential pair of traces 525 may have 16 differential pairs of traces, with 16 P signal lines routed between serializer 515 and deserializer 550 in a first layer and 16 N signal lines routed between serializer 515 and deserializer 550 in a second layer that is adjacent to the first layer. Alternatively, the 16 differential pairs of traces may be routed in two or more adjacent layers of the PCB of apparatus 205-a. For instance, P signal lines 1-8 of differential pair of traces 525 may be routed in a first layer between serializer 515 and deserializer 550 and N signal lines 1-8 may be routed between serializer 515 and deserializer 550 in a second layer adjacent to the first layer, while P signal lines 9-16 of differential pair of traces 525 may be routed between serializer 515 and deserializer 550 in a third layer and N signal lines 9-16 may be routed between serializer 515 and deserializer 550 in a fourth layer adjacent to the third layer, etc.

Figure 6:
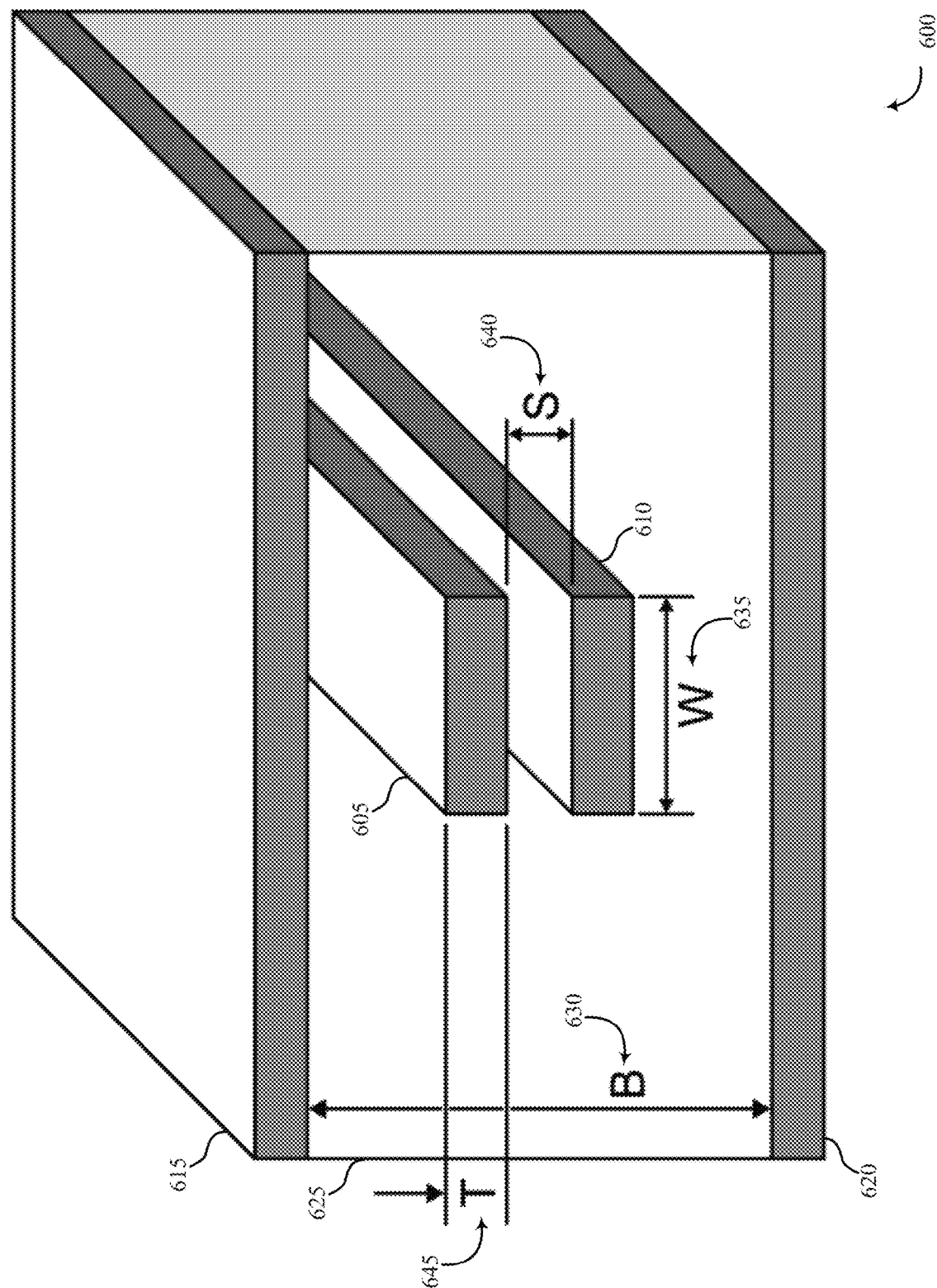
FIG. 6 shows another embodiment of an environment in accordance with various aspects of this disclosure.

FIG. 6 shows an environment 600 for routing of conductive traces in a printed circuit board, in accordance with various examples. Environment 600 may be one example of environment 500 of FIG. 5. At least one aspect of environment 600 may be implemented in conjunction with device 105 of FIG. 1, apparatus 205 of FIG. 2, and/or broadside coupling module 130 depicted in FIGS. 1, 2, 3, and/or 4.

In one embodiment, environment 600 may depict a cross-section of a printed circuit board. As one example, environment 600 may depict a cross-section of four layers of a printed circuit board. As depicted, environment 600 may include a first trace 605, a second trace 610, a first reference plane 615, a second reference plane 620, and substrate 625 between first reference plane 615 and second reference plane 620 and in which first trace 605 and second trace 610 are embedded.

In one embodiment, first trace 605 may be broadside coupled with second trace 610. First trace 605 and second trace 610 may be one example of a differential pair of traces. For instance, first trace 605 and second trace 610 may be an example of the differential pairs of traces 525, 530, 555, and/or 560 depicted in FIG. 5. In one embodiment, a differential signal may be transmitted over first trace 605 and second trace 610. For example, the P signal of a differential signal may be driven on first trace 605 and the N signal of the differential signal may be driven on second trace 610.

In one embodiment, first trace 605 may be routed in a first layer of a printed circuit board and second trace 610 may be routed in a second layer of the printed circuit board adjacent to the first layer. In some cases, first reference plane 615 may be set in a third layer of the printed circuit board adjacent to the first layer, and second reference plane 620 may be in a fourth layer of the printed circuit board adjacent to the second layer.

In some embodiments, environment 600 may depict one or more physical aspects or dimensions associated with at least one of the first trace 605, second trace 610, first reference plane 615, and second reference plane 620, or any combination thereof. For example, at least one of first trace 605 and second trace 610, or both, may be configured with a trace thickness 645 of T, and a trace width 635 of W. In some embodiments, first trace 605 and second trace 610 may have a trace spacing 640 of S. In some cases, first reference plane 615 and second reference plane 620 may be configured to have a substrate height 630 of B.

FIG. 7 shows an environment 700 for routing of conductive traces in a printed circuit board, in accordance with various examples. Environment 700 may be one example of environment 500 of FIG. 5 and/or environment 600 of FIG. 6. At least one aspect of environment 700 may be implemented in conjunction with device 105 of FIG. 1, apparatus 205 of FIG. 2, and/or broadside coupling module 130 depicted in FIGS. 1, 2, 3, and/or 4.

In one embodiment, environment 700 may depict a cross-section of a printed circuit board (PCB) stack. As one example, environment 700 may depict a cross-section of 10 layers of a printed circuit board stack. As depicted, environment 700 may include a column of layers 705, a column of thickness 710 of each layer, an illustration of the PCB stack 715, a column of layer type 720, and a column of layer description 725. As illustrated, layer 1 may have a thickness of 0.0452 mm with a finished thickness of 18 μm with copper plating, followed by a fill with a thickness of 0.0698 mm and with a dielectric constant (Dk) of 3.61 and dielectric factor (Df) of 0.0149. Next, layer 2 may have a thickness of 0.0152 mm and may be a ground plane or power plane and have a finished thickness of 18 μm, followed by a core with a thickness of 0.0635 mm and with a dielectric constant (Dk) of 3.66 and dielectric factor (Df) of 0.0147. Next, layer 3 may have a thickness of 0.0152 mm and may be a signal layer with a finished thickness of 18 μm, followed by a fill with a thickness of 0.1499 and with a dielectric constant (Dk) of 3.81 and dielectric factor (Df) of 0.0139. Next, layer 4 may have a thickness of 0.0152 mm and may be a signal layer with a finished thickness of 18 μm, followed by a core with a thickness of 0.0635 mm and with a dielectric constant (Dk) of 3.66 and dielectric factor (Df) of 0.0147, and so forth.

In one embodiment, a first trace of a first differential pair of traces may be routed in layer 3 and a second trace of the first differential pair of traces may be routed in layer 4, where the first trace in layer 3 is broadside coupled to the second trace in layer 4. In one embodiment, a third trace of a second differential pair of traces may be routed in layer 7 and a fourth trace of the second differential pair of traces may be routed in layer 8, where the third trace in layer 7 is broadside coupled to the fourth trace in layer 8. In some cases, two or more differential pairs of traces may be routed in layers 3 and 4, and/or in layers 7 and 8.

In the illustrated example, the total thickness in millimeters may be 0.9719 mm over plated copper, 0.9119 mm after lamination thickness, and 0.9830 mm over laminate thickness or a finished thickness of 0.9830 mm as one example. Conversely, a standard PCB stack using edge coupling may have a finished thickness of 1.6 mm. Thus, by implementing broadside coupling in the PCB stack the dimensions of the PCB stack are reduced. Also, the coupling of electric fields between differential traces is increased with broadside coupled differential traces as the broadside coupled differential traces use the whole trace width for coupling, while with the typical edge coupled differential pair only the edges of the differential traces are used for the coupling area. Using the whole trace width for coupling makes broadside coupled differential traces have less crosstalk to adjacent traces.

Figure 8:
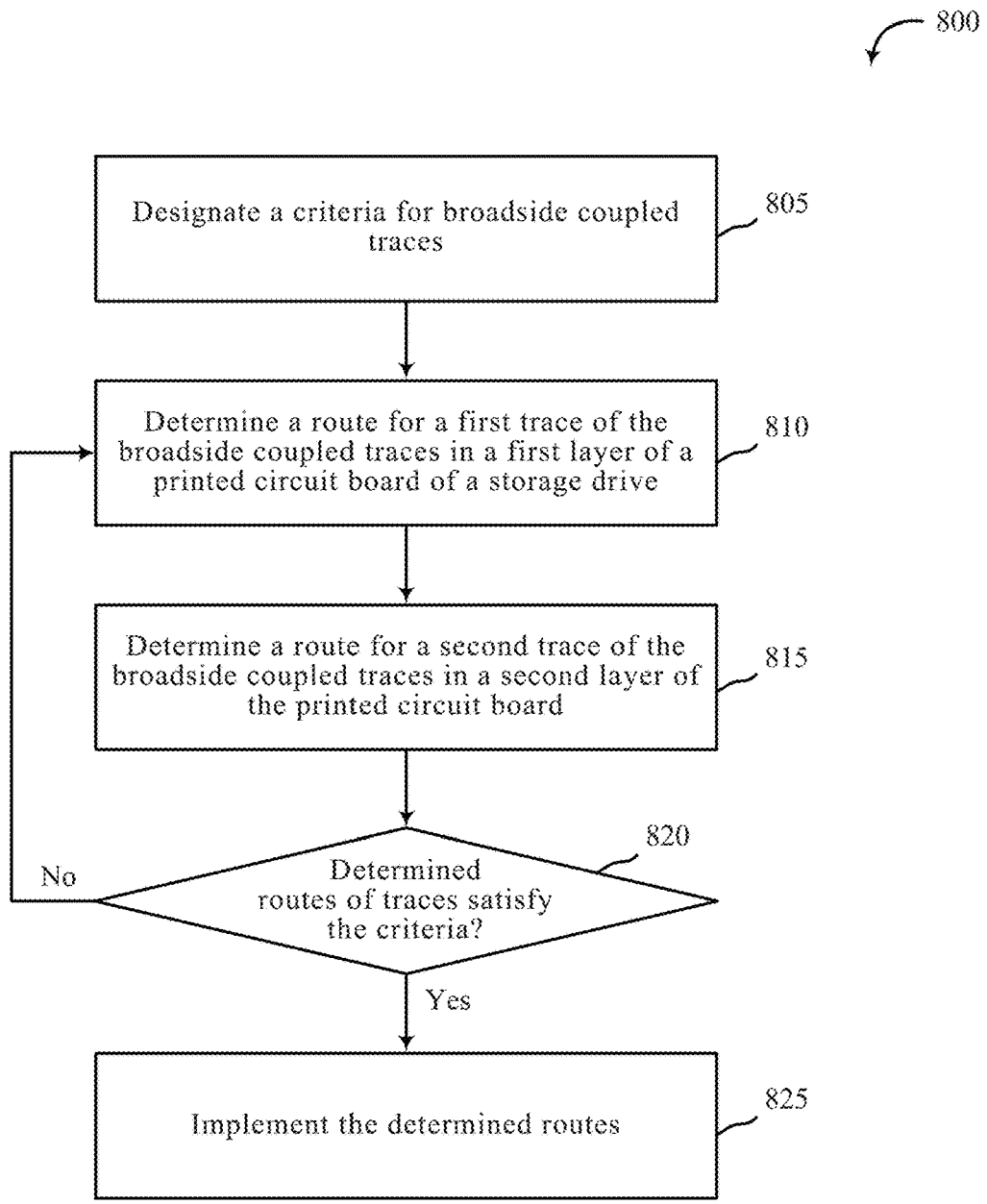
FIG. 8 is a flow chart illustrating an example of a method in accordance with various aspects of this disclosure.

FIG. 8 is a flow chart illustrating an example of a method 800 for routing of conductive traces in a printed circuit board, in accordance with various aspects of the present disclosure. One or more aspects of the method 800 may be implemented in conjunction with device 105 of FIG. 1, apparatus 205 of FIG. 2, and/or broadside coupling module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 805, the method 800 may include designating a differential impedance criteria for one or more broadside coupled traces. At block 810, the method 800 may include determining a route for a first trace of the broadside coupled traces in a first layer of a printed circuit board of a storage drive. At block 815, the method 800 may include determining a route for a second trace of the broadside coupled traces in a second layer of the printed circuit board. In some cases, the determined routes of the first trace and the second trace are routed between a serializer/deserializer (SerDes) of a first controller of the storage drive and a SerDes of a second controller of the storage driver.

At block 820, the method 800 may include determining whether the determined routes of the traces satisfy the differential impedance criteria. At block 825, the method 800 may include implementing the determined routes upon determining the determined routes of the traces satisfy the differential impedance criteria. Upon determining the determined routes of the traces fail to satisfy the differential impedance criteria, method 800 may continue determining the route for the first trace of the broadside coupled traces in the first layer of the printed circuit board of the storage drive and/or continue determining the route for the second trace of the broadside coupled traces in a second layer of the printed circuit board.

In some cases, continuing to determine the route for the first trace may include modifying and/or fine tuning one or more physical aspects of the first trace. In some cases, continuing to determine the route for the second trace may include modifying and/or fine tuning one or more physical aspects of the second trace.

The operations at blocks 805-825 may be performed using the broadside coupling module 130 described with reference to FIGS. 1-4 and/or another module. Thus, the method 800 may provide for routing of conductive traces in a printed circuit board. It should be noted that the method 800 is just one implementation and that the operations of the method 800 may be rearranged, omitted, and/or otherwise modified such that other implementations are possible and contemplated.

Figure 9:
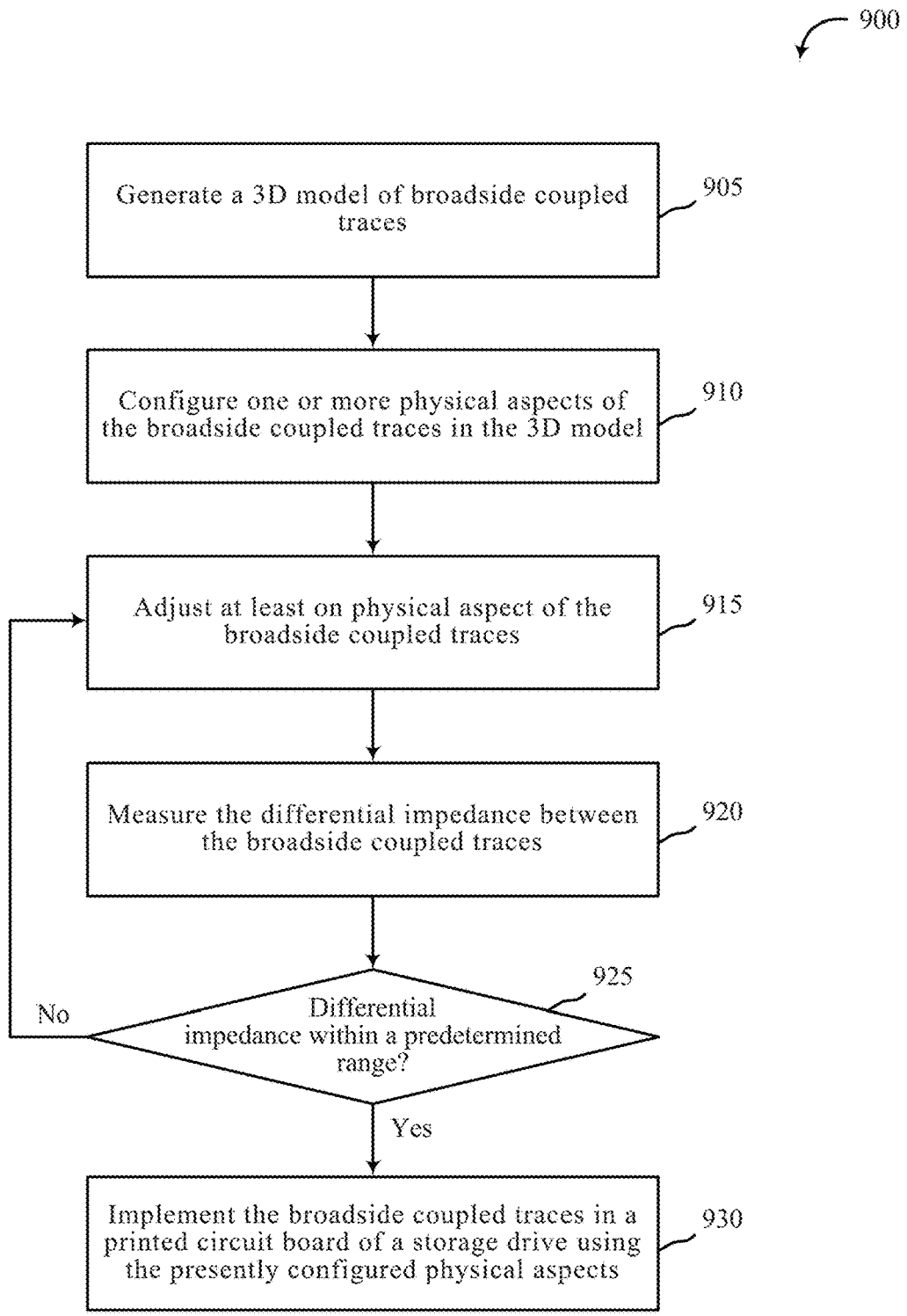
FIG. 9 is a flow chart illustrating an example of a method in accordance with various aspects of this disclosure.

FIG. 9 is a flow chart illustrating an example of a method 900 for routing of conductive traces in a printed circuit board, in accordance with various aspects of the present disclosure. One or more aspects of the method 900 may be implemented in conjunction with device 105 of FIG. 1, apparatus 205 of FIG. 2, and/or broadside coupling module 130 depicted in FIGS. 1, 2, 3, and/or 4. In some examples, a backend server, computing device, and/or storage device may execute one or more sets of codes to control the functional elements of the backend server, computing device, and/or storage device to perform one or more of the functions described below. Additionally or alternatively, the backend server, computing device, and/or storage device may perform one or more of the functions described below using special-purpose hardware.

At block 905, the method 900 may include generating a 3D model of broadside coupled traces. At block 910, the method 900 may include configuring one or more physical aspects of the broadside coupled traces in the 3D model. In some cases, the one or more physical aspects may be based on a least one of a distance between the first trace and the second trace, a distance between the first trace and a first reference plane, a dimension of the first reference plane, a distance between the second trace and a second reference plane, a dimension of the second reference plane, a width of the first trace, or a width of the second trace, a thickness of the first trace, a thickness of the second trace, a dielectric value of a substrate in which the first trace and the second trace are embedded, or any combination thereof.

At block 915, the method 900 may include adjusting at least on physical aspect of the broadside coupled traces. At block 920, the method 900 may include measuring the differential impedance between the broadside coupled traces. At block 925, the method 900 may include determining whether the measured differential impedance is within a predetermined range of differential impedances. At block 920, the method 900 may include implementing the broadside coupled traces in a printed circuit board of a storage drive upon determining the measured differential impedance is within the predetermined range of differential impedances. In some cases, the broadside coupled traces may have the physical aspects configured in block 910. Upon determining the measured differential impedance is within the predetermined range of differential impedances, method 900 may include continuing to configure and/or adjust the one or more physical aspects of the broadside coupled traces in the 3D model.

The operation(s) at block 905-930 may be performed using the broadside coupling module 130 described with reference to FIGS. 1-4 and/or another module. Thus, the method 900 may provide for routing of conductive traces in a printed circuit board. It should be noted that the method 900 is just one implementation and that the operations of the method 900 may be rearranged, omitted, and/or otherwise modified such that other implementations are possible and contemplated.

In some examples, aspects from two or more of the methods 800 and 900 may be combined and/or separated. It should be noted that the methods 800 and 900 are just example implementations, and that the operations of the methods 800 and 900 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disc, as used herein, include any combination of compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:
1. A storage system comprising:
a storage drive;
a printed circuit board of the storage drive;
a first trace routed in a first layer of the printed circuit board of the storage drive, the first trace and other traces of the printed circuit board electrically connect- ing components of the printed circuit board, components of the storage drive, or both;

a second trace routed in a second layer of the printed circuit board, the second layer being adjacent to the first layer; and the first trace and the second trace together comprising a differential pair of traces as the first trace and the second trace are routed on the first layer and second layer, respectively, from a serializer/deserializer (SerDes) of a first controller of the storage drive to a SerDes of a second controller of the storage drive.

2. The storage system of claim 1, wherein the storage system further comprises:

a third trace and a fourth trace routed between a SerDes of a connector of the storage drive and the SerDes of the first controller, wherein the third trace is in the first layer and the fourth trace is in the second layer, or the third trace is in a third layer and the fourth trace is in a fourth layer adjacent to the third layer.

3. The storage system of claim 2, wherein the storage drive connector is configured to:

receive data from a host of the storage drive and provide the data to the SerDes of the storage drive connector, wherein the SerDes of the storage drive connector provides the data to the SerDes of the first controller over the third trace and the fourth trace.

4. The storage system of claim 3, wherein the first controller is configured to:

transmit at least a portion of the data to the second controller over the first trace and the second trace, wherein the second controller is configured to write the at least portion of the data to one or more NAND dies of the storage drive controlled by the second controller.

5. The storage system of claim 2, wherein the storage drive connector includes at least one of a serial advanced technology attachment (SATA) connector, mini SATA (mSATA) connector, SATA Express connector, small computer system interface (SCSI) connector, serially attached SCSI (SAS) connector, peripheral component interconnect express (PCie) connector, M.2 connector, U.2 connector, non-volatile memory express (NVMe) connector, or any combination thereof.

6. The storage system of claim 1, wherein the first controller drives the first trace and the second trace with a differential signal to communicate data between the first controller and the second controller.

7. The storage system of claim 6, wherein the differential impedance between the first trace and the second trace is between 50 and 100 Ohms when the first trace and the second trace are driven by the differential signal, wherein the differential signal comprises the first trace being driven by a first signal and the second trace simultaneously being driven by a second signal that is equal in magnitude, opposite in polarity, and symmetrical to the first signal.

8. The storage system of claim 7, wherein the differential impedance between the first trace and the second trace depends on at least one or more physical aspects of the first trace and the second trace.

9. The storage system of claim 8, wherein the one or more physical aspects of the first trace and the second trace includes at least one of a distance between the first trace and the second trace, a width of the first trace, a width of the second trace, a thickness of the first trace, a thickness of the second trace, a height of a substrate in which the traces are embedded, a dimension of a first reference plane, a dimension of a second reference plane, a distance between the first trace and a first reference plane, a distance between the second trace and a second reference plane, a relative permittivity of the substrate, or any combination thereof.

10. The storage system of claim 1, wherein the storage drive includes a solid state drive, and wherein a first dielectric is placed between the first trace and the second trace, a second dielectric is placed above the first trace, a third dielectric is placed below the second trace, a first reference plane is placed above the first dielectric, and a second reference plane is placed above the third dielectric.

11. An apparatus comprising:

a first trace routed in a first layer of a printed circuit board of the apparatus, the first trace and other traces of the printed circuit board electrically connecting components of the printed circuit board, components of the apparatus, or both;

a second trace routed in a second layer of the printed circuit board, the second layer being adjacent to the first layer; and the first trace and the second trace together comprising a differential pair of traces as the first trace and the second trace are routed on the first layer and second layer, respectively, from a serializer/deserializer (SerDes) of a first controller of the apparatus to a SerDes of a second controller of the apparatus.

12. The apparatus of claim 11, comprising:

a third trace and a fourth trace routed between a SerDes of a connector of the apparatus and the SerDes of the first controller, wherein the third trace is in the first layer and the fourth trace is in the second layer, or the third trace is in a third layer and the fourth trace is in a fourth layer adjacent to the third layer.

13. The apparatus of claim 12, comprising:

the apparatus connector to receive data from a host of the apparatus and provide the data to the SerDes of the apparatus connector, wherein the SerDes of the apparatus connector provides the data to the SerDes of the first controller over the third trace and the fourth trace.

14. The apparatus of claim 13, comprising:

the first controller to transmit the data to the second controller over the first trace and the second trace, wherein the second controller is configured to write the data to one or more NAND dies of the apparatus controlled by the second controller.

15. The apparatus of claim 12, wherein the apparatus connector includes at least one of a serial advanced technology attachment (SATA) connector, mini SATA (mSATA) connector, SATA Express connector, small computer system interface (SCSI) connector, serially attached SCSI (SAS) connector, peripheral component interconnect express (PCie) connector, M.2 connector, U.2 connector, non-volatile memory express (NVMe) connector, or any combination thereof.

16. The apparatus of claim 11, wherein the first controller drives the first trace and the second trace with a differential signal to communicate data between the first controller and the second controller.

17. The apparatus of claim 16, wherein the differential impedance between the first trace and the second trace is between 50 and 100 Ohms when the first trace and the second trace are driven by the differential signal, wherein the differential signal comprises the first trace being driven by a first signal and the second trace simultaneously being driven by a second signal that is equal in magnitude, opposite in polarity, and symmetrical to the first signal.

18. The apparatus of claim 17, wherein the differential impedance between the first trace and the second trace depends on at least one or more aspects of the first trace and the second trace.

\* \* \* \* \*